United States Patent
Nishida et al.

(10) Patent No.: US 6,825,131 B2
(45) Date of Patent: Nov. 30, 2004

(54) METHOD FOR FORMING DIELECTRIC THIN FILM AND DIELECTRIC THIN FILM FORMED THEREBY

(75) Inventors: Koichi Nishida, Shiga-ken (JP); Yutaka Takeshima, Nagaokakyo (JP); Koki Shibuya, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/339,564

(22) Filed: Jan. 10, 2003

(65) Prior Publication Data

US 2003/0139064 A1 Jul. 24, 2003

(30) Foreign Application Priority Data

Jan. 16, 2002 (JP) .......................................... 2002-007170
Dec. 2, 2002 (JP) .......................................... 2002-349874

(51) Int. Cl.[7] .......................... H01L 21/31; H01L 21/469
(52) U.S. Cl. .................................... 438/778; 438/781
(58) Field of Search ................................ 438/778, 781, 438/FOR 395

(56) References Cited

U.S. PATENT DOCUMENTS

| | | | | |
|---|---|---|---|---|
| 5,589,300 A | * | 12/1996 | Fauteux et al. | 429/223 |
| 5,894,064 A | * | 4/1999 | Hampden-Smith et al. | 438/3 |
| 6,048,817 A | * | 4/2000 | Sagae et al. | 502/117 |
| 6,444,763 B1 | * | 9/2002 | Sagae et al. | 526/126 |
| 6,583,071 B1 | * | 6/2003 | Weidman et al. | 438/787 |
| 2002/0033173 A1 | * | 3/2002 | Shofner et al. | 128/200.22 |

FOREIGN PATENT DOCUMENTS

| | | | | | |
|---|---|---|---|---|---|
| EP | 328742 A | * | 8/1989 | ........... | C01G/43/00 |
| JP | 01298011 A | * | 12/1989 | ........... | C01B/19/04 |
| JP | 02196022 A | * | 8/1990 | ........... | C01G/15/00 |
| JP | 03109207 A | * | 5/1991 | ........... | C01B/13/34 |
| JP | 9-213643 | | 8/1997 | | |
| JP | 2001011635 A | * | 1/2001 | ......... | C23C/16/448 |
| JP | 2002-38270 A | | 2/2002 | | |
| JP | 2002038270 A | * | 2/2002 | ........... | C23C/16/40 |

* cited by examiner

Primary Examiner—George Fourson
Assistant Examiner—Michelle Estrada
(74) Attorney, Agent, or Firm—Keating & Bennett, LLP

(57) ABSTRACT

A method for forming a dielectric thin film includes a film deposition step of spraying a material solution onto a heated substrate under a reduced pressure by a two-fluid technique using an inert gas to deposit a thin film. The material solution is supplied at a rate that is greater than the vaporization rate of the solvent in the film deposited on the substrate. The supply of the material solution is stopped and the solvent remaining in the film is vaporized remaining solvent. Then, the film is heat-treated in an oxidizing atmosphere. The substrate is heated to a temperature in the range of about 100° C. to about 300° C. Thus, a dielectric thin film having reliability can be formed even if the film thickness is small.

16 Claims, 3 Drawing Sheets

METHOD FOR FORMING DIELECTRIC THIN FILM AND DIELECTRIC THIN FILM FORMED THEREBY

BACKGROUND OF THE INVENTION

1. Field of the Invention

The present invention relates to methods for forming a dielectric thin film, and more particularly to a method for forming a dielectric thin film using a solution containing starting materials.

2. Description of the Related Art

In order to form a dielectric thin film, using a material solution, the following methods have been applied:

(1) Liquid Source CVD (LSCVD): a solution in which organic metal materials are uniformly dissolved is vaporized to react with the surface of a substrate, thus forming an oxide thin film.

(2) Metal Organic Deposition (MOD): a solution in which organic metal materials are uniformly dissolved is applied, dried, calcined, and fired to form an oxide thin film.

(3) A spray method: a material solution is sprayed onto the surface of a substrate, followed by drying and firing to form an oxide thin film (for example, a solution is sprayed onto a substrate by ultrasonic waves, and is subsequently heated to dry and heat-treated to form a thin film, as disclosed in, for example, Japanese Unexamined Patent Application Publication No. 9-213643).

However, the LSCVD method described as method (1) above, requires the use of expensive compounds having a high vapor pressure as raw materials because the raw materials must be in a gas form to be applied onto a substrate. Thus, LSCVD has disadvantage in that it is very expensive.

On the other hand, the MOD method described as method (2), and the spray method, described as method (3), have no vapor pressure requirement because a solution containing raw materials is applied in a liquid form onto a substrate. However, the vaporized solvent passes through the deposited film during drying to form cavities which are likely to cause a short circuit between electrodes disposed on both surfaces of the resulting film if the film thickness is small. It is thus difficult to form a reliable dielectric thin film.

SUMMARY OF THE INVENTION

In order to overcome the problems described above, preferred embodiments of the present invention provide a method for forming a dielectric thin film having high reliability, and provide a dielectric thin film formed by the novel method.

According to a preferred embodiment of the present invention, a method for forming a dielectric thin film includes the steps of (a) spraying a material solution including a starting material and a solvent onto a heated substrate under a reduced pressure by a two-fluid technique using an inert gas to deposit a thin film, and (b) subjecting the thin film to heat treatment in an oxidizing atmosphere.

By performing this film deposition step, the steps of drying and calcining the deposited film, which are necessary in known methods, such as the MOD method and the spray method, can be eliminated. Thus, the vaporization of the solvent from the deposited film is prevented and the occurrence of cavities (loopholes of solvent vapor) is reliably prevented in the thin film. Consequently, a short circuit between electrodes disposed on both surfaces of the film is reliably prevented. Thus, a reliable dielectric thin film can be provided.

In the method of preferred embodiments of the present invention, characteristics of the resulting dielectric thin film depend on conditions for film deposition before heat treatment rather than on heat treatment conditions. Therefore, by selecting the conditions for film deposition, a reliable dielectric thin film can be efficiently formed.

Also, by heat-treating the deposited thin film in an oxidizing atmosphere, organic constituents of organic metal compounds in the material solution are surely burned and removed. Thus, a reliable, precise dielectric thin film can be provided.

More specifically, in the method of preferred embodiments of the present invention, the solvent in the sprayed material solution is rapidly vaporized to be removed immediately after reaching the surface of the heated substrate. Thus, a film hardly including any of the solvent can be deposited on the substrate.

Thus, the vaporization of the solvent from the deposited film can be prevented and, thus, the occurrence of cavities in the resulting thin film is prevented. Consequently, a reliable dielectric thin film can be achieved in which short circuits do not occur between electrodes, even if the electrodes are disposed on both surfaces of the film.

Preferably, the material solution is sprayed under conditions that a major portion of the solvent vaporize immediately soon after the solvent reaches a surface of the substrate.

By spraying the material solution under conditions allowing a major portion of the solvent to vaporize immediately, the vaporization of the solvent is prevented in the deposited thin film and the occurrence of cavities in the resulting thin film is reliably prevented and minimized. Thus, a reliable dielectric thin film can be provided.

Preferably, the film deposition step and the heat treatment step are performed two or more times.

By subjecting one substrate to the film deposition and heat treatment steps two or more times, a reliable, precise dielectric thin film in which short circuits do not occur can be provided.

If the material solution includes an organic metal compound, very few cavities or voids are inevitably formed in the thin film when the organic constituents of the organic metal compound are removed, even if the solvent can be efficiently removed in the film deposition step. However, by repeating the film deposition step and the heat treatment step, the cavities or voids, which are likely to cause short circuits, are filled, so that the occurrence of short circuits can be reliably prevented.

Preferably, the material solution includes at least one metallic element in a total concentration of approximately 0.01 mol/L or less.

By using a material solution including approximately 0.01 mol/L or less of the metallic element, the size of lumps formed by the solidification of drops of the sprayed material solution can be reduced and, thus, a dielectric thin film having a uniform, small thickness can be achieved.

Since the substrate is heated in the method of preferred embodiments of the present invention, a material solution having an excessively high concentration is likely to result in lumps having a grain size as large as several micrometers. This makes it difficult to form a dielectric thin film having a thickness as small as a submicron. Also, the surface morphology is significantly degraded due to the resulting rough surface.

The inventors conducted an experiment to determine a suitable concentration of the material solution for forming a film having an adequately small thickness. As a result, it has been discovered and shown that, by using a material solution having a metallic element concentration of approximately 0.01 mol/L or less, the size of lumps formed on the surface of the substrate can be reduced so that the thickness of the dielectric thin film becomes uniform and small. Therefore, it is preferable to use a material solution having a metallic element concentration of approximately 0.01 mol/L or less.

According to another preferred embodiment of the present invention, a method for forming a dielectric thin film includes the steps of (a) spraying a material solution including a starting material and a solvent onto a heated substrate under a reduced pressure by a two-fluid technique using an inert gas to deposit a thin film, (b) stopping the supply of the material solution and vaporizing the solvent remaining in the thin film, and (c) subjecting the thin film to heat treatment in an oxidizing atmosphere.

The heat treatment step is performed after the film deposition step and the solvent vaporization step is preferably repeated once or more times. Also, the material solution is supplied at a rate that is greater than the vaporization rate of the solvent in the film deposited on the substrate.

By supplying the material solution at a rate that is greater than the vaporization rate of the solvent in the film to deposit a thin film, then vaporizing the solvent remaining in the film with the material solvent not supplied, and heat-treating the film in an oxidizing atmosphere, the vaporization of the solvent is prevented in the deposited thin film and, thus, the occurrence of cavities is reliably prevented in the resulting thin film. Thus, a reliable dielectric thin film is provided.

Although the method includes the solvent vaporization step after the film deposition step, the solvent is proactively vaporized by heating the substrate during film deposition. The deposited film is gradually dried from the substrate side while the solvent is vaporized. Thus, the occurrence of cavities can be prevented in the solvent vaporization step effectively, and consequently, a reliable dielectric thin film is provided.

In this method, the supply rate of the material solution can be increased to increase the speed of film formation.

The speed of film formation in this method is a few times to several tens of times higher than that of other processes of preferred embodiments of the present invention.

Also, the material solution can be efficiently adhered to the substrate to increase raw material efficiency.

Preferably, the film deposition step is performed at a pressure of approximately 13.3 kPa (100 Torr) or less.

By setting the pressure in the film deposition step at approximately 13.3 kPa or less, a reliable dielectric thin film which has excellent characteristics and does not exhibit short circuits even if the thickness is small is provided.

Preferably, the thickness of a film deposited at one time is approximately 50 nm or less.

By setting the thickness of a film deposited at one time to be approximately 50 nm or less, cavities are surely prevented and thus, a reliable dielectric thin film can be achieved. If the thickness deposited at one time becomes larger than approximately 50 nm, the solvent vaporized from the film easily passes through the thin film to undesirably form cavities.

Preferably, the solvent vaporization step is performed at a pressure lower than the pressure in the film deposition step.

By setting the pressure in the solvent vaporization step lower than the film deposition step, the solvent can be efficiently vaporized and removed.

Preferably, the substrate is heated to a temperature in the range of about 100° C. to about 300° C.

By heating the substrate to about 100° C. to about 300° C. in the film deposition step, a reliable dielectric thin film can be achieved which has excellent characteristics and does not exhibit short circuits even if the thickness is small.

A temperature of higher than about 300° C. leads to the decomposition of the solvent, thus allowing the thin film to include a large amount of decomposition products. The decomposition products remain in the thin film even after heat treatment, consequently increasing leak current in comparison with in the case of a temperature of about 300° C. or less. Accordingly, it is preferable to set the temperature for heating the substrate at about 300° C. or less.

The temperature for heating the substrate can be reduced to about 100° C. without problems. However, a temperature of lower than about 100° C. reduces the vaporization rate of the solvent of the material solution to allow a large amount of the solvent to remain in the thin film. This significantly degrades the surface morphology and the resulting dielectric thin film is liable to exhibit a short circuit. Accordingly, it is preferable to set the temperature for heating the substrate in the range of about 100° C. to about 300° C.

Preferably, the heat treatment is performed at a temperature of about 500° C. or more.

By setting the temperature for heat treatment at about 500° C. or more, organic constituents of an organic metal compound included in the material solution can be surely burned and removed. Thus, a reliable, precise dielectric thin film can be achieved.

Preferably, the material solution includes (a) titanium and barium; or (b) titanium and strontium.

By using a material solution including titanium and barium; or titanium and strontium, a reliable barium titanate or strontium titanate dielectric thin film having various uses can be efficiently formed.

Other preferred embodiments of the present invention are directed to a dielectric thin film formed by the method according to the preferred embodiments described above. The dielectric thin film of such a preferred embodiment preferably has (a) crystallinity; (b) a thickness of about 200 nm or less; and (c) a relative dielectric constant of about 250 or more.

The dielectric thin film has high reliability and can be suitably used for multilayer ceramic electronic components such as monolithic ceramic capacitors.

The dielectric thin film may be formed by repeating the film deposition and heat treatment steps one or more times.

By subjecting one substrate to the film deposition and heat treatment steps two or more times, the resulting dielectric thin film has high reliability and does not exhibit a short circuit even if electrodes are disposed on both surfaces thereof. Thus, the dielectric thin film can be suitably used for multilayer ceramic electronic components such as monolithic ceramic capacitors.

Also, other preferred embodiments of the present invention are directed to another dielectric thin film formed by other methods according to preferred embodiments of the present invention. This dielectric thin film according to another preferred embodiment preferably has (a) crystallinity; and (b) a relative dielectric constant of about 250 or more.

The dielectric thin film has high reliability and does not exhibit a short circuit even if electrodes are disposed on both surfaces thereof. Thus, the dielectric thin film can be suitably used for multilayer ceramic electronic components such as monolithic ceramic capacitors.

Preferably, the dielectric thin film includes (a) titanium and barium; or (b) titanium and strontium.

The resulting barium titanate or strontium titanate dielectric thin film has high reliability and various uses.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The present invention will now be further illustrated with reference to preferred embodiments thereof.

Figure 1:
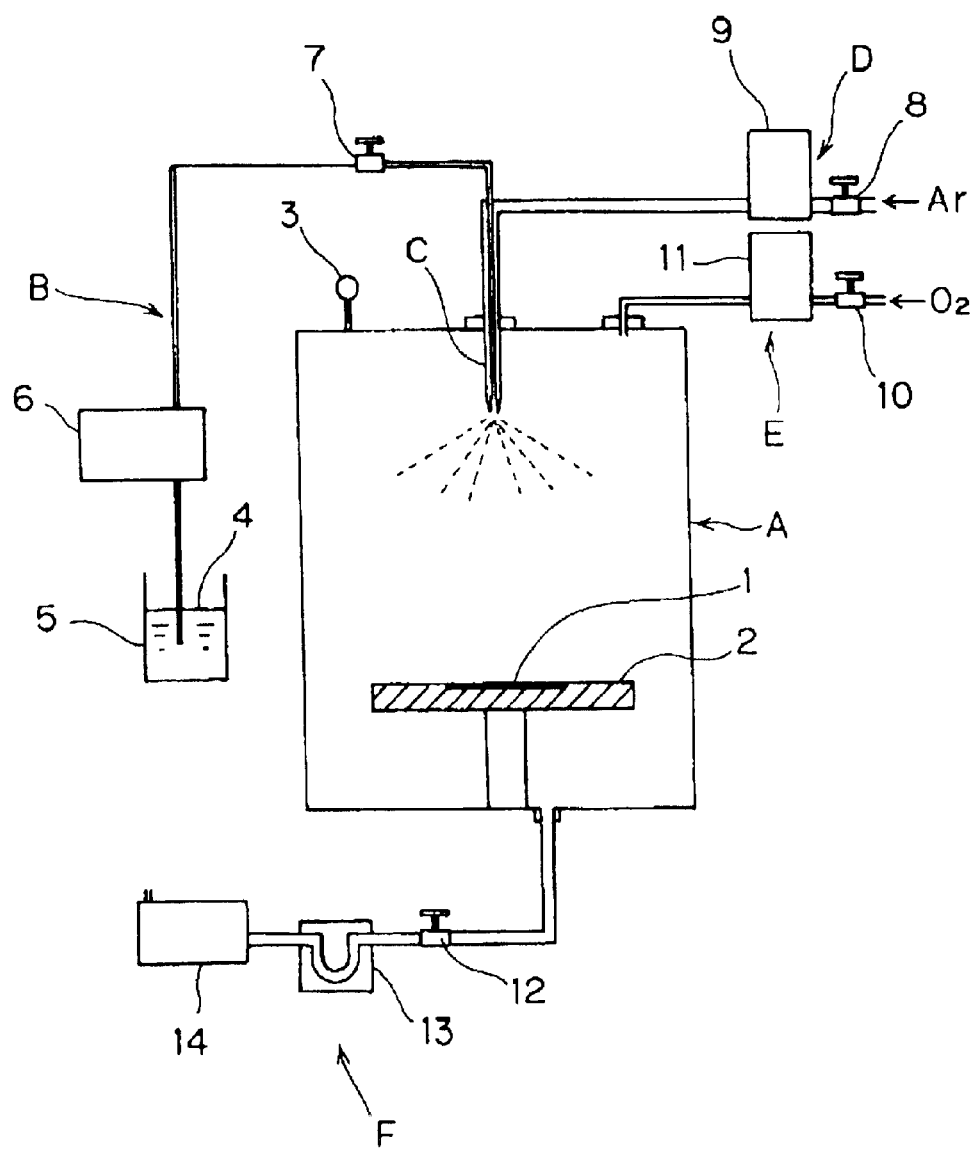
FIG. 1 is a schematic illustration of an apparatus for forming a dielectric thin film by a method according to a preferred embodiment of the present invention.

FIG. 1 shows an apparatus for forming dielectric thin films, and the dielectric thin films of Examples were formed with this apparatus by a method according to preferred embodiments of the present invention.

The apparatus has a film-forming chamber A for forming dielectric thin films, a material feeder B for supplying a material solution including a starting material of a dielectric thin film and a solvent, and a two-fluid nozzle C for atomizing the material solution and supplying the atomized solution to the film-forming chamber A, an inert gas feeder D for supplying an inert gas (Ar gas in the Examples) used to atomize the material solution to the two-fluid nozzle C, an oxygen gas feeder E for supplying oxygen gas to the film-forming chamber A, and an exhaust system F for exhausting the gas from the film-forming chamber A and for sucking in the gas until a degree of vacuum in the chamber A reaches a predetermined degree of vacuum.

In the film-forming chamber A, a stage 2 is arranged to place a substrate 1 thereon. The stage 2 includes a heater for heating the substrate 1 to a predetermined temperature. The film-forming chamber A also has a pressure gauge 3 for indicating the internal pressure thereof.

The material feeder B includes a material vessel 5 to place the material solution 4 in and a pump 6 for delivering the material solution 4 to the two-fluid nozzle C, and a flow controlling valve 7.

The two-fluid nozzle C is intended to atomize the material solution 4 by a two-fluid technique, and its end is positioned inside the film-forming chamber A so that the spray of the atomized material solution 4 is emitted to the substrate 1.

Figure 2:
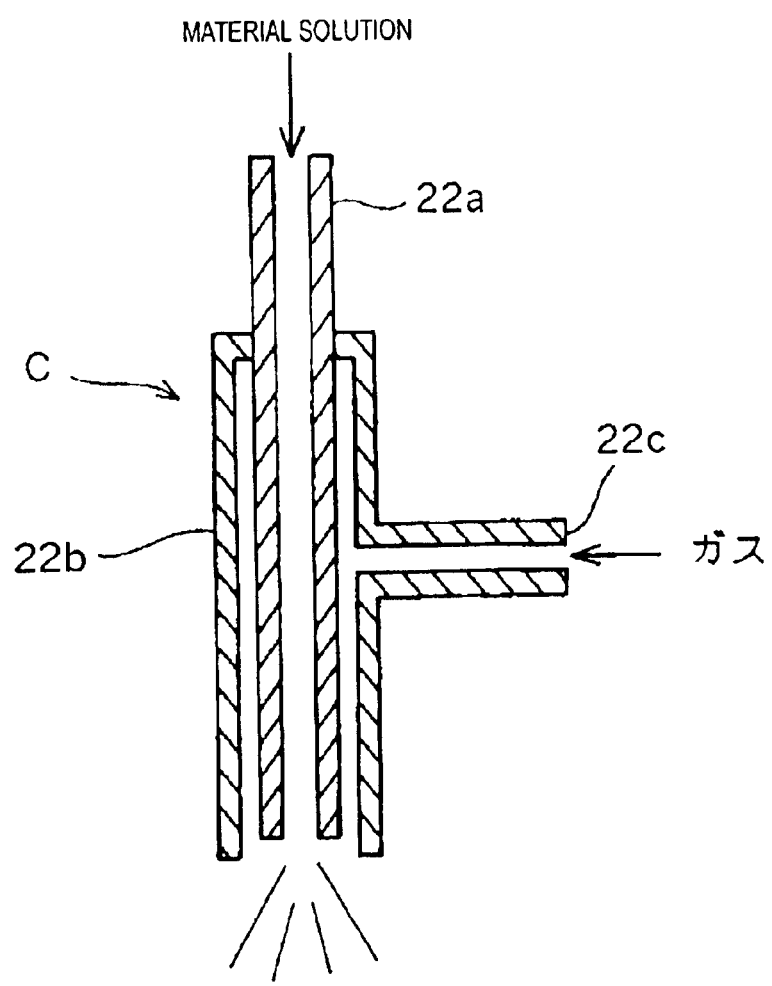
FIG. 2 is a schematic illustration of a two-fluid nozzle used in the apparatus shown in FIG. 1.

As shown in FIG. 2, the two-fluid nozzle C includes a central tube 22a through which the material solution 4 passes and an external tube 22b with a gas inlet 22c disposed outside the central tube 22a. While the gas introduced from the gas inlet 22c passes through the space between the central tube 22a and the external tube 22b, the material solution delivered through the central tube 22a is mixed with the gas and splayed. Thus, the material solution is introduced in an atomized form into the film-forming chamber A. In this preferred embodiment of the present invention, the central tube 22a preferably has an inside diameter of about 0.25 mm and an outside diameter of about 1.59 mm, and the external tube 22b has an inside diameter of about 2.30 mm. Hence, the material solution passes through a substantially cylindrical region having a diameter of about 0.25 mm and the gas passes through a toroidal region having an inside diameter of about 1.59 mm and an outside diameter of about 2.30 mm.

The inert gas feeder D is intended to supply the inert gas used for spraying the material solution in the two-fluid nozzle C. The inert gas feeder D includes a pressure control valve 8 and a mass flow controller 9 so that the inert gas is delivered to the two-fluid nozzle C at a predetermined speed.

The oxygen gas feeder E is intended to supply oxygen ($O_2$) gas to the film-forming chamber A to make the inside of the chamber an atmosphere of oxygen gas during heat treatment. The oxygen gas feeder E includes a pressure control valve 10 and a mass flow controller 11 so that the oxygen gas is supplied to the film-forming chamber A at a predetermined speed.

The exhaust system F is intended to reduce the internal pressure of the film-forming chamber A to a predetermined vacuum and to exhaust gas from the film-forming chamber A. The exhaust system F has a pressure control valve 12, a liquid nitrogen trap 13, and a rotary pump (vacuum pump) 14.

A method for forming a dielectric thin film with this apparatus will now be described.

EXAMPLE 1

(1) TiO(acac)$_2$, Ba(acac)$_2$.2H$_2$O, and Sr(acac)$_2$.2H$_2$O were weighed out in amounts equivalent to about 0.000362 mol of barium and strontium in total and about 0.00155 of titanium, and were dissolved in 2-methoxyethanol. The total volume of the solution was adjusted to approximately 1000 mL, and thus, a material solution was prepared.

(2) The internal pressure of the film-forming chamber was reduced to about 0.013 kPa (0.1 Torr) or less with the rotary pump 14. A Si substrate 1 coated with a SiO$_2$ layer on the surface thereof and having a Ti layer and a Pt electrode on the rear surface thereof in that order, that is, a Pt/Ti/SiO$_2$/Si substrate, was placed on the stage 2 and heated to about 240° C. Ar gas was supplied to the film-forming chamber A at a flow rate of about 7 L/min with the mass flow controller 9, and the internal pressure of the film-forming chamber A was maintained at about 2.66 kPa (20 Torr) with the pressure control valve 12.

(3) The material solution was continuously supplied to the film-forming chamber A with the pump 6 at a rate of about 2 mL/min for approximately 360 minutes to deposit a thin film on the Pt/Ti/SiO$_2$/Si substrate 1.

After stopping the supply of the material solution, the temperature of the stage 2 was reduced to room temperature. The film-forming chamber A was purged with Ar gas and the internal pressure of the film-forming chamber A was increased to atmospheric pressure.

(5) With the film-forming chamber A opened and exposed to the atmosphere, the stage 2 was heated at about 650° C. for approximately 3 hours to heat-treat (fire) the dielectric thin film while the gas flow ratio of Ar gas to O$_2$ gas was adjusted to about 4 to 1. Thus, a barium-strontium titanate (BST) dielectric thin film (Sample A) was formed.

The resulting BST dielectric thin film (Sample A) was provided with twenty Pt electrodes of about 500 μm in diameter on the surface thereof by sputtering. The capacitance of each Pt electrode was measured. As a result, eighteen out of the twenty electrodes were short-circuited. Hence, the percentage of short circuits was 90%.

The points where no short circuit had occurred were subjected to measurements of tan δ at 1 kHz, thicknesses of the dielectric film, relative dielectric constants, and leak currents at an applied voltage of about 1.0 V. The results are as follows:

(1) tan δ at 1 kHz: about 10.5%
(2) dielectric thin film thickness: about 200 nm
(3) relative dielectric constant: about 150
(4) leak current at an impressed voltage of 1.0 V: about $1 \times 10^{-4}$ A·cm$^{-2}$ Also, the composition of the dielectric thin film was analyzed, and consequently the proportion of the metal elements constituting the film was (barium+strontium):titanium=52:48.

The dielectric thin film of Example 1 exhibited a high percentage of short circuits of 90%, and the relative dielectric constant of 150 and the leak current of about $1 \times 10^{-4}$ A·cm$^{-2}$ are not necessarily satisfactory results. However, these results are better than those of a dielectric film formed by applying a material solution in a liquid form onto a substrate as in the MOD method or the spray method. Therefore, by selecting conditions for film deposition and heat treatment, a dielectric thin film that is more reliable than the dielectric thin films formed by a known method, such as the MOD method or the spray method, can be efficiently formed.

EXAMPLE 2

A film was deposited for approximately 90 minutes using the same material solution as in Example 1 under the same conditions as in Example 1, including the substrate temperature, vacuum, Ar flow rate, and supply rate of the material solution. The resulting film was subjected to heat treatment under the same conditions as in Example 1, and subsequently the same film deposition step and heat treatment step were repeated. Hence, the film deposition step and the heat treatment step were performed twice. Thus, a BST dielectric thin film (Sample B) was formed.

The resulting BST dielectric thin film (Sample B) was provided with twenty Pt electrodes of about 500 μm in diameter on the surface thereof by sputtering. The capacitance of each Pt electrode was measured. As a result, four out of the twenty electrodes were short-circuited. Hence, the percentage of short circuits was 20%.

The points where no short circuit had occurred were subjected to measurements of tan δ at 1 kHz, thicknesses of the dielectric thin film, relative dielectric constants, and leak currents at an applied voltage of about 1.0 V. The results are as follows:

(1) tan δ at 1 kHz: about 4.2%
(2) dielectric film thickness: about 80 nm
(3) relative dielectric constant: about 250
(4) leak current at an impressed voltage of 1.0 V: about $1 \times 10^{-6}$ A·cm$^{-2}$ Thus, Sample B, which is formed by repeating the film deposition step and the heat treatment, exhibited better characteristics than those of Sample A, that is, a tan δ of 4.2%, a relative dielectric constant of about 250, and a leak current of about $1 \times 10^{-6}$ A·cm$^{-2}$.

Also, the composition of the dielectric thin film was analyzed, and consequently the proportion of the metal elements constituting the film was (barium+strontium):titanium=52:48.

EXAMPLE 3

A film was deposited for approximately 60 minutes using the same material solution as in Examples 1 and 2 under the same conditions as in Example 1, including the substrate temperature, vacuum, Ar flow rate, and supply rate of the material solution. The resulting film was subjected to heat treatment under the same conditions as in Example 1, and subsequently the same film deposition step and heat treatment were repeated twice. Hence, the film deposition step and the heat treatment were performed three times. Thus, a BST dielectric thin film (Sample C) was formed.

The resulting BST dielectric thin film (Sample C) was provided with twenty Pt electrodes of about 500 μm in diameter on the surface thereof by sputtering. The capacitance of each Pt electrode was measured. As a result, three out of the twenty electrodes were short-circuited. Hence, the percentage of short circuits was 15%.

The points where no short circuit had occurred were subjected to measurements of tan δ at 1 kHz, thicknesses of the dielectric film, relative dielectric constants, and leak currents at an applied voltage of about 1.0 V. The results are as follows:

(1) tan δ at 1 kHz: about 2.7%
(2) dielectric film thickness: about 90 nm
(3) relative dielectric constant: about 250
(4) leak current at an impressed voltage of 1.0 V: about $1 \times 10^{-7}$ A·cm$^{-2}$ Thus, Sample C, which is formed by performing the film deposition step and the heat treatment three times, exhibited still better characteristics than those of Samples A and B, that is, a tan δ of about 2.7%, a relative dielectric constant of 250, and a leak current of about $1 \times 10^{-7}$ A·cm$^{-2}$.

Also, the composition of the dielectric thin film was analyzed, and consequently the proportion of the metal elements constituting the film was (barium+strontium):titanium=52:48.

In Examples 1, 2, and 3, a solution in which TiO(acac)$_2$, Ba(acac)$_2$.2H$_2$O, and Sr(acac)$_2$.2H$_2$O dissolved in 2-methoxyethanol was used as the material solution. However, the material solution is not limited to this, and various constituents may be used to achieve the same effects.

In Examples 1, 2, and 3, the Pt/Ti/SiO$_2$/Si substrate was used as a substrate of the dielectric film. However, the type of the substrate is not particularly limited and various types of substrates may be used.

EXAMPLE 4

(1) The following compounds were used as Ba, Sr, Ti raw materials:

Ba(C$_5$H$_7$O$_2$)$_2$.2H$_2$O;
Sr(C$_5$H$_7$O$_2$)$_2$.2H$_2$O; and
TiO(C$_5$H$_7$O$_2$)$_2$ (2) The Ba, Sr, and Ti raw materials were compounded at a ratio of about 1:1:3, and dissolved in 2-methoxyethanol (boiling point at atmospheric pressure: 125° C.) while stirring for about 60 minutes using a magnetic stir. Thus a material solution having a total molarity of about 0.005 mol/L was prepared.

(3) The material solution was sprayed onto a substrate at a rate that is greater than the vaporization rate of the solvent in the deposited film on the substrate, as shown in Table 1, with the film-forming apparatus shown in FIG. 1. Thus, a dielectric thin film was deposited. The temperature of the substrate was set at about 300° C. The spray gas was Ar, and the substrate was an R-plane sapphire substrate provided with a Pt film having a thickness of 200 nm on the surface thereof by sputtering.

TABLE 1

| | |
|---|---|
| Ba raw material | Ba $(C_5H_7O_2)_2.2H_2O$ |
| Sr raw material | Sr $(C_5H_7O_2)_2.2H_2O$ |
| Ti raw material | TiO $(C_5H_7O_2)_2$ |
| Solvent | 2-methoxyethanol |
| Ba:Sr:Ti mole ratio | 1:1:3 |
| Material concentration | 0.005 mol/L |
| Material solution supply rate | 1 g/min |
| Ar gas flow rate | 10 L/min |
| Film deposition temperature | 170° C. |
| Film-forming chamber pressure | 10.64 kPa (80 Torr) |
| Film-deposition time | 30 min |

The above-described conditions leads to a wet film because a portion of the solvent remains in the film.

(4) The supply of the material solution was stopped simultaneously with the completion of film deposition, and the pressure control valve 12 of the film-forming chamber A, shown in FIG. 1, was fully opened to remove the solvent remaining in the film by vaporization, with the substrate temperature maintained at about 300° C. The solvent in the film is rapidly vaporized and thus, the surface of the film is dried. The internal pressure of the film-forming chamber A becomes about 2.66 kPa (20 Torr) in the solvent vaporization step.

(5) The film deposition step described in (3) and the solvent vaporization step described in (4) were repeated a plurality of times to form a dielectric thin film having a thickness of about 500 nm.

Figure 3:
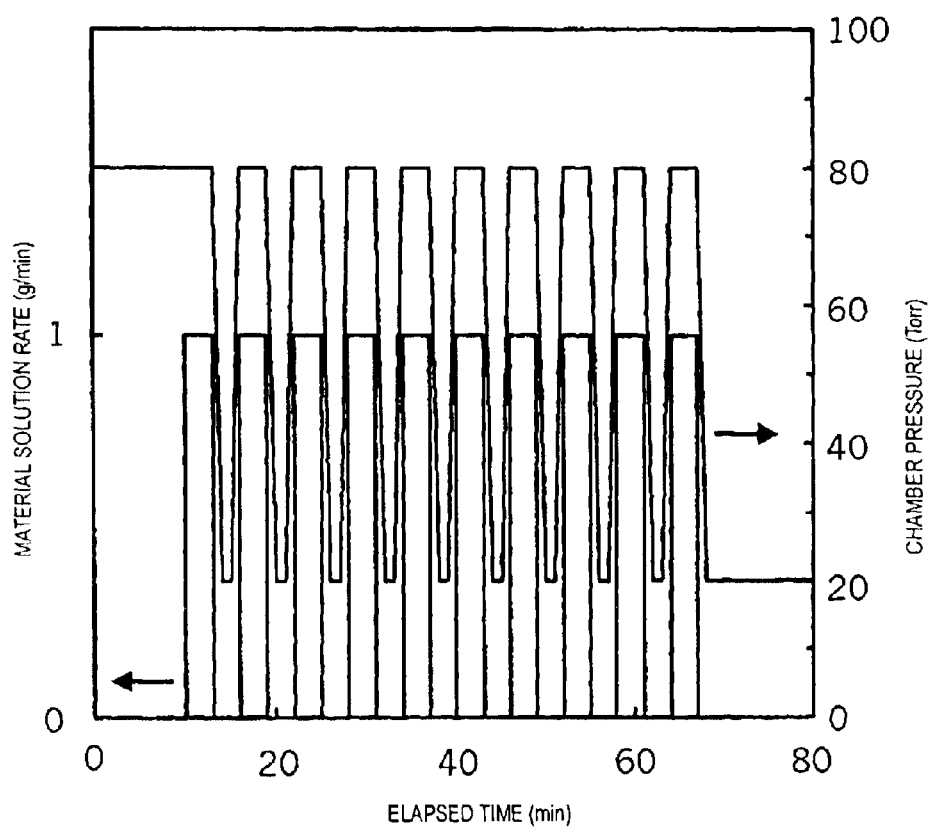
FIG. 3 is a graph showing the relationship with time between the supply rate of a material solution and the internal pressure of a film-forming chamber in the film-deposition and solvent vaporization steps in Example 4.

FIG. 3 shows the relationship with time between the supply rate of the material solution and the internal pressure of the film-forming chamber in the film-deposition step and the solvent vaporization step in Example 4. In Example 4, the total time for forming the thin film was approximately 60 minutes, including the total film-deposition time of approximately 30 minutes.

The resulting film having a thickness of about 500 nm, formed in Example 4 by repeating the steps of film deposition (3) and solvent vaporization (4) a plurality of times, did not exhibit cracks even when examined by microscopy.

Thus, by spraying the material solution onto the substrate at a rate that is greater than the vaporization rate of the solvent in the film on the substrate and by repeating these film deposition and drying steps, a dielectric thin film having no cracks can be efficiently formed.

(6) The thin film was subjected to heat treatment in an oxidizing atmosphere (in the air in Example 4) at about 650° C. for approximately 3 hours. Thus, a multiple oxide dielectric thin film was completed which has reliability and a high dielectric constant.

COMPARATIVE EXAMPLE

A dielectric thin film having a thickness of about 500 nm was formed by continuously depositing the material solution for approximately 30 minutes under the same conditions as in Example 4.

In this instance, while a dielectric thin film of about 500 nm in thickness was formed at a time, a large number of cracks having a width of about 200 nm to about 2 μm occurred. This is probably because when a deposited film having a relatively large thickness is dried, the solvent is vaporized to reduce the volume of the film, with a low adhesion between the resulting thin film and the Pt film on the substrate.

The thin film having the large number of cracks was subjected to heat treatment in an oxidizing atmosphere (in the air) at about 650° C. for approximately 3 hours to complete a dielectric thin film. The resulting dielectric thin film exhibited a dielectric constant lower than that of the film of Example 4 and, thus, the reliability was unsatisfactory.

It is undesirable to excessively reduce the supply rate of the material solution because the solvent in the spray is excessively vaporized to seriously reduce the efficiency of material deposition on the substrate, even if the film-deposition step and the solvent vaporization step are repeated and then heat treatment is performed, as in Example 4.

In Example 4, a solution having a predetermined concentration in which $Ba(C_5H_7O_2)_2.2H_2O$, $Sr(C_5H_7O_2)_2.2H_2O$, and $TiO(C_5H_7O_2)_2$ are dissolved in 2-methoxyethanol was used as the material solution. However, the material solution is not limited to this, and various constituents may be used to lead to the same effects.

In Examples 4, an R-plane sapphire substrate provided with a Pt film at a thickness of about 200 nm by sputtering was used as a substrate of the dielectric thin film. However, the type of the substrate is not particularly limited and various types of substrates may be used.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A method for forming a dielectric thin film, comprising:
   (a) a film deposition step of spraying a material solution including a starting material and a solvent onto a heated substrate under a pressure that is less than atmospheric pressure by a two-fluid technique using an inert gas to deposit a thin film; and
   (b) a heat treatment step of subjecting the thin film to heat treatment in an oxidizing atmosphere; wherein
   the film deposition step and the heat treatment step are performed at least two times.

2. A method for forming a dielectric thin film according to claim 1, wherein the material solution is sprayed under conditions allowing a major portion of the solvent reaching the substrate to vaporize immediately.

3. A method for forming a dielectric thin film according to claim 1, wherein the material solution includes at least one metallic element in a total concentration of about 0.01 mol/L or less.

4. A method for forming a dielectric thin film according to claim 1, wherein the film deposition step is performed at a pressure of 13.3 kPa or less.

5. A method for forming a dielectric thin film according to claim 1, wherein the substrate is heated to a temperature in the range of 100 to 300° C.

6. A method for forming a dielectric thin film according to claim 1, wherein the heat treatment is performed at a temperature of 500° C. or more.

7. A method for forming a dielectric thin film according to claim 1, wherein the material solution includes titanium and one of barium and strontium.

8. A method for forming a dielectric thin film, comprising:
   (a) a film deposition step of spraying a material solution including a starting material and a solvent onto a heated substrate under a pressure that is less than atmospheric pressure by a two-fluid technique using an inert gas to deposit a thin film, wherein the material solution is supplied at a greater rate than the vaporization rate of the solvent in the film deposited on the substrate;

(b) a solvent vaporization step of stopping the supply of the material solution and vaporizing the solvent remaining in the thin film; and (c) a heat treatment step of subjecting the thin film to heat treatment in an oxidizing atmosphere, the heat treatment step being performed after the film deposition step and the solvent vaporization step are repeated at least once.

9. A method for forming a dielectric thin film according to claim 8, wherein the material solution is sprayed under conditions allowing a major portion of the solvent reaching the substrate to vaporize immediately.

10. A method for forming a dielectric thin film according to claim 8, wherein the film deposition step and the heat treatment step are performed at least two times.

11. A method for forming a dielectric thin film according to claim 8, wherein the film deposition step is performed at a pressure of about 13.3 kPa or less.

12. A method for forming a dielectric thin film according to claim 8, wherein the thickness of a film deposited at one time is about 50 nm or less.

13. A method for forming a dielectric thin film according to claim 8, wherein the solvent vaporization step is performed at a pressure lower than the pressure in the film deposition step.

14. A method for forming a dielectric thin film according to claim 8, wherein the substrate is heated to a temperature in the range of about 100° C. to about 300° C.

15. A method for forming a dielectric thin film according to claim 8, wherein the heat treatment is performed at a temperature of about 500° C. or more.

16. A method for forming a dielectric thin film according to claim 8, wherein the material solution includes titanium and one of barium and strontium.

\* \* \* \* \*